United States Patent
Goszewski et al.

(10) Patent No.: US 6,801,922 B2
(45) Date of Patent: Oct. 5, 2004

(54) SAMPLING RATE CONVERTER AND METHOD

(75) Inventors: Cynthia P. Goszewski, Dallas, TX (US); Steven R. Magee, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 627 days.

(21) Appl. No.: 09/873,592

(22) Filed: Jun. 4, 2001

(65) Prior Publication Data

US 2002/0046227 A1 Apr. 18, 2002

Related U.S. Application Data

(60) Provisional application No. 60/209,033, filed on Jun. 2, 2000.

(51) Int. Cl.$^7$ .................................................. G06F 17/10
(52) U.S. Cl. ........................................ 708/313; 341/61
(58) Field of Search .................................. 708/313, 315; 341/61

(56) References Cited

U.S. PATENT DOCUMENTS

| 5,661,478 | A | * | 8/1997 | Matsushige | .................. 341/61 |
| 5,903,482 | A | * | 5/1999 | Iwamura et al. | ............ 708/313 |
| 6,014,682 | A | * | 1/2000 | Stephen et al. | ............. 708/313 |
| 6,275,836 | B1 | * | 8/2001 | Lu | ............................. 708/313 |
| 6,311,201 | B1 | * | 10/2001 | Albright | ..................... 708/313 |

* cited by examiner

Primary Examiner—David H. Malzahn
(74) Attorney, Agent, or Firm—Carlton H. Hoel; W. James Brady; Frederick J. Telecky, Jr.

(57) ABSTRACT

Variable sample rate converter by convolution of input data samples with an impulse response to produce output samples with the impulse response values generated by interpolation from a table of oversampled values with the oversampling rate lower for outlying lobes of the impulse response.

3 Claims, 7 Drawing Sheets

SAMPLING RATE CONVERTER AND METHOD

RELATED APPLICATIONS

This application claims priority from provisional patent application Ser. No. 60/209,033, filed Jun. 2, 2000.

BACKGROUND OF THE INVENTION

The invention relates to electronic devices, and, more particularly, to circuitry and methods for conversion of sampling rates of digitally sampled data.

Audio systems currently are required to handle data with various sampling rates, from low rates found in many .WAV files such as 8 kHz to high rates of consumer audio equipment such as 48 kHz. Audio is a key feature of PC multimedia with system requirements approaching those of consumer high fidelity systems for a fraction of the cost. For example, the PC 2001 specification sets high quality audio requirements to play out audio streams at 44.1 and 48 kHz rates. A hardware vendor may choose to supply a codec that only supports 48 kHz. In this case, sample rate conversion between 44.1 and 48 kHz is needed.

For rates that are integral multiples of 48 kHz, interpolation between samples to the higher data rate can be accomplished with an FIR filter with a pre-computed set of coefficients for each fixed rate handled by the system. For rates that are not integral multiples of 48 kHz, a direct filter approach to achieve a high quality (98 dB SNR) would require a large set of filter coefficients (more than 10,000 coefficients) plus a large cycle execution. Several methods have been developed which break the filter into a set of smaller taps which interpolate to a common frequency then decimate to the desired frequency.

The most common audio sampling rates are multiples of either 48 kHz or 44.1 kHz. The lowest common multiple rate for conversion from 44.1 kHz to 48 kHz is over 7 MHz. This is an integer ratio of 160 to 147. A possible multi-staged filter would be 2:2:2:2:2:5::3:7:7. This would reduce the coefficients from over 10,000 taps to close to 100 taps. Yet this approach has problems, including an intermediate sampling rate of over 7 MHz and a cycle intensive operation because the filter would be applied on every data sample.

T. Ramstad, Digital Methods for Conversion Between Arbitrary Sampling Frequencies, 32 IEEE Tr.ASSP 577 (1984) presents a general theory of filtering methods for interfacing time-discrete systems with different sampling rates (frequencies). Indeed, Ramstad includes the use of Taylor series coefficients for improved interpolation accuracy, especially in regions where the impulse response varies rapidly.

J. O. Smith, Bandlimited Interpolation—Introduction and Algorithm, CCRMA (1993) details a sampling rate conversion using an oversampled windowed impulse response function with interpolation for the filter coefficients.

SUMMARY OF THE INVENTION

Instead of interpolating between filter coefficients and then filtering (as prior methods), the present invention provides sampling rate conversion by filtering the data twice with a table of windowed impulse response samples created with different oversampling rates for different portions of the impulse response and then interpolating between the two results.

This has the advantages of smaller memory use and simple processing while retaining the quality of uniformly sampled impulse response filter coefficient methods.

BRIEF DESCRIPTION OF THE DRAWINGS

The drawings are heuristic for clarity.

DESCRIPTION OF THE PREFERRED EMBODIMENTS

Overview

The preferred embodiments provide sampling rate conversion for a (band-limited) digital data stream by filtering an input data stream with a filter having coefficients defined by interpolated samples of an oversampled (windowed) impulse response function where the oversampling is at a lower rate for portions of the impulse response away from the center.

Figure 13:
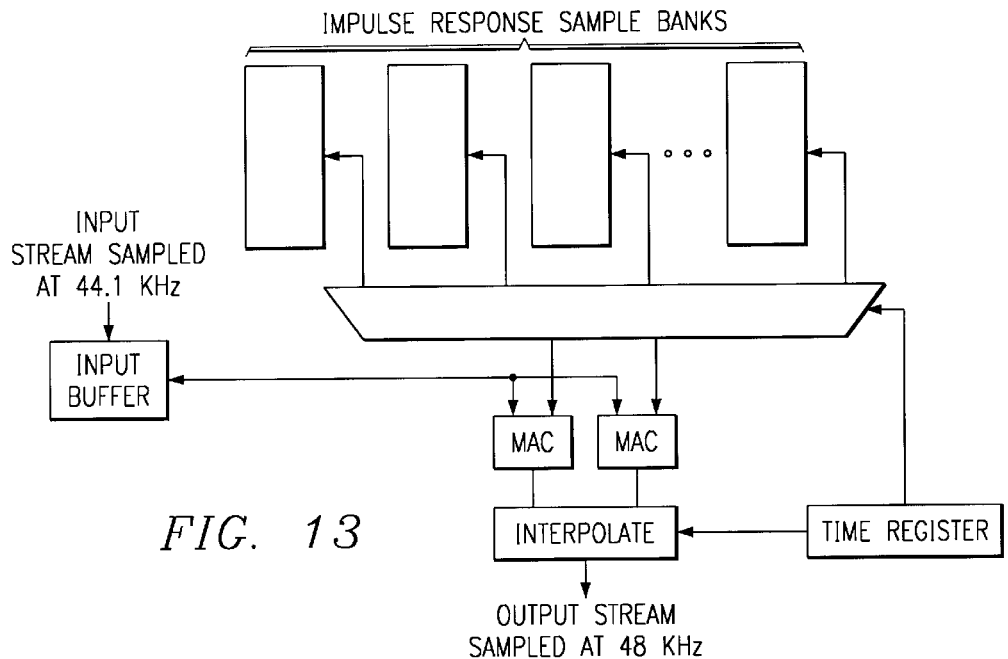
FIG. 13 is a preferred embodiment system for rate conversion.

FIG. 13 illustrates a preferred embodiment rate converter system which includes a digital signal processor core with filter coefficients in memory organized into banks according to the sampling rate for rate conversion filtering of an input digital audio stream representing a (band-limited) signal sampled at 44.1 kHz and converting this to an output digital audio stream representing the signal sampled at 48 kHz. Of course, other rate conversions also may be used.

First Preferred Embodiment

Preliminarily, first consider the approach of filtering with interpolated uniformly oversampled windowed impulse response filter coefficients as described in the Smith article cited in the Background.

Bandlimited interpolation of discrete-time signals is a basic tool having extensive application in digital signal processing. In general, the problem is to correctly compute signal values at arbitrary continuous times from a set of discrete-time samples of the signal amplitude. In other words, we must be able to interpolate the signal between the input samples. Since the original signal is always assumed to be bandlimited to half the sampling rate, (otherwise aliasing distortion would occur upon sampling), Shannon's sampling theorem tells us the signal can be exactly and uniquely reconstructed for all times from its samples by bandlimited interpolation.

Considerable research has been devoted to the problem of interpolating discrete points. In many of these techniques, the signal is first interpolated by an integer factor L and then decimated by an integer factor M. This provides sampling-rate conversion by any rational factor L/M. The conversion requires a digital lowpass filter whose cutoff frequency depends on max{L,M}. While sufficiently general, this formulation is less convenient when it is desired to resample the signal at arbitrary times or change the sampling-rate conversion factor smoothly over time.

The following describes a resampling method which evaluates a signal at any time specifiable by a fixed-point number. In addition, one lowpass filter is used regardless of the sampling-rate conversion factor. The method effectively implements the "analog interpretation" of rate conversion in which a certain lowpass-filter impulse response must be available as a continuous function. Continuity of the impulse response is simulated by linearly interpolating between samples of the impulse response stored in a table. Due to the relatively low cost of memory, the method is quite practical for hardware implementation.

The "analog interpretation" of sampling rate conversion can be described as follows. Suppose x(nT) are samples of a continuous absolutely integrable signal x(t), where t is time in seconds (real), n ranges over the integers, and T is the sampling period. Assume x(t) is bandlimited to ±F/2, where F=1/T is the sampling rate. That is, if X(w) denotes the Fourier transform of x(t):

$$X(w)=\int x(t)e^{-jwt}dt$$

then x(t) being bandlimited means X(w)=0 for |w|>F/2. Consequently, Shannon's sampling theorem implies x(t) can be uniquely reconstructed from the samples x(nT) via $$x(t)=\Sigma_n h_s(t-nT)x(nT) \quad (1)$$

where $$h_s(t)=\sin(\pi t/T)/\pi t/T=\sin c(t/T)$$

with the last equality defining the sinc(.) function. To resample x(t) at a new sampling rate F'=1/T', we need only evaluate the rightside of equation (1) at t values which are integer multiples of T'.

When the new sampling rate F' is less than the original rate F, a lowpass cutoff must be placed below half the new lower sampling rate to avoid aliasing. Thus, in the case of an ideal lowpass filter, $h_s(t)=\min\{F,F'\} \text{sinc}(\min\{F,F'\}t)$, where the scale factor maintains unity gain in the passband.

Figure 1:
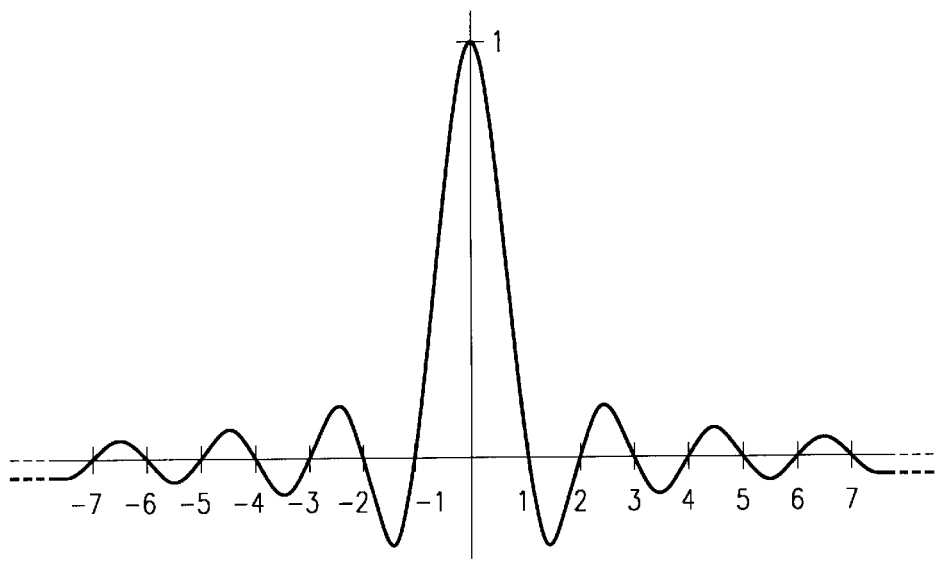
FIG. 1 is a graph of the sinc( ) function.

FIG. 1 is a graph of the function sinc(.) for the first seven zero-crossings to the left and right of the origin.

If $\circledx$ denotes the discrete convolution operation for digital signals, then equation (1) can be written as $x(t)=h_s\circledx (t)$.

Equation (1) can be interpreted as a superposition of shifted and scaled sinc functions. A sinc function instance is translated to each signal sample and scaled by that sample, and the instances are all added together. Note that zero-crossings of sinc(z) occur at all integers except z=0. That means at time t=nT (i.e., on a sample instant), the only contribution to the sum is the single sample x(nT). All other samples contribute sinc functions which have a zero-crossing at time t=nT. Thus, the interpolation goes precisely through the existing samples, as it should.

Figure 2:
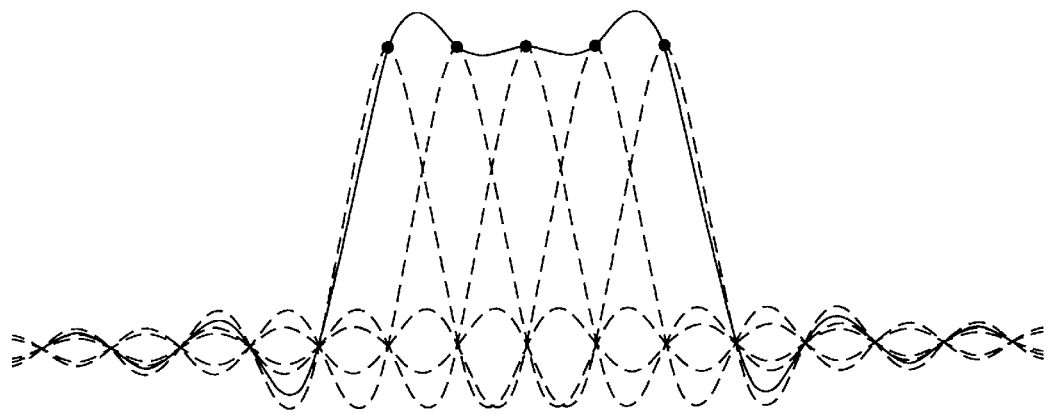
FIG. 2 shows reconstruction using sinc functions.

FIG. 2 is a plot indicating how sinc functions sum together to reconstruct bandlimited signals. The figure shows a superposition of five sinc functions, each at unit amplitude, and displaced by one-sample intervals. These sinc functions would be used to reconstruct the bandlimited interpolation of the discrete-time signal x(nT)=( . . . 0,0,1,1, 1,1,1,0,0 . . . ). Note that at each sampling instant that t=nT, the solid line passes exactly through the tip of the sinc function for that sample; this is just a restatement of the fact that the interpolation passes through the existing samples.

Since the nonzero samples of the digital signal are all 1, we might expect the interpolated signal to be very close to 1 over the nonzero interval: however, this is far from the case. The deviation from unity between samples can be thought of as "overshoot" or "ringing" of the lowpass filter which cuts off at half the sampling rate, or it can be considered a "Gibbs phenomenon" associated with bandlimiting.

A second interpretation of equation (1) is as follows: to obtain the interpolation at time t, shift the signal samples under one sinc function so that time t in the signal is translated under the peak of the sinc function, then create the output as a linear combination of signal samples where the coefficient of each signal sample is given by the value of the sinc function at the location of each sample. That this interpretation is equivalent to the first can be seen as a change of variable in the convolution sum. In the first interpretation, all signal samples are used to form a linear combination of shifted sinc functions, while in the second interpretation, samples from one sinc function are used to form a linear combination of samples of the shifted input signal. The practical bandlimited interpolation method may be based on the second interpretation.

The summation in equation (1) cannot be implemented in practice because the "ideal lowpass filter" impulse response $h_s(t)$ actually extends from minus infinity to plus infinity. It is necessary in practice to window the ideal impulse response so as to make it finite. This is the basis of the window method for digital filter design. While many other filter design techniques exist, the window method is simple and robust, especially for very long impulse responses. In the case of the method presented below, the filter impulse response is very long because it is heavily oversampled.

Figure 3:
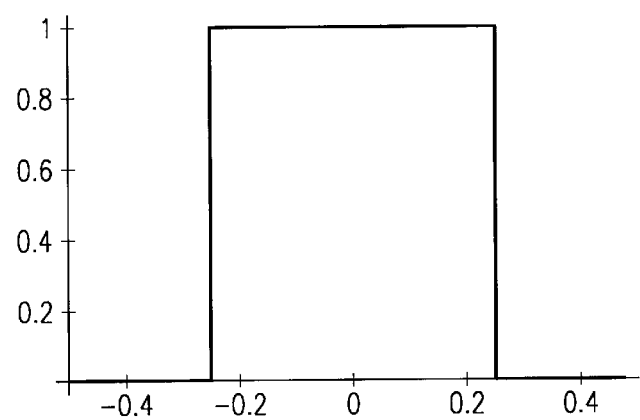
FIG. 3 is a graph of the frequency of an ideal lowpass response.
Figure 4:
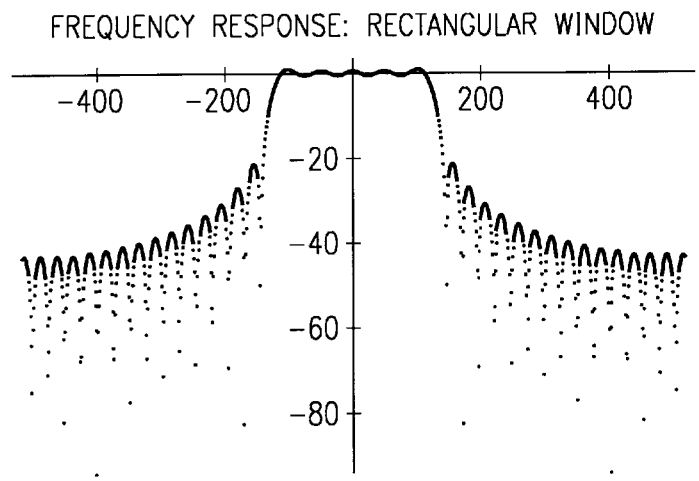
FIGS. 4–5 are graphs showing the effect of windowing on frequency response.

FIG. 3 shows the frequency response of the ideal lowpass filter. This is just the Fourier transform of $h_s(t)$. Truncating $h_s(t)$ at the fifth zero-crossing to the left and to the right of the origin yields the frequency response shown in FIG. 4. Note that the stopband exhibits only slightly more than 20 dB rejection.

Figure 5:
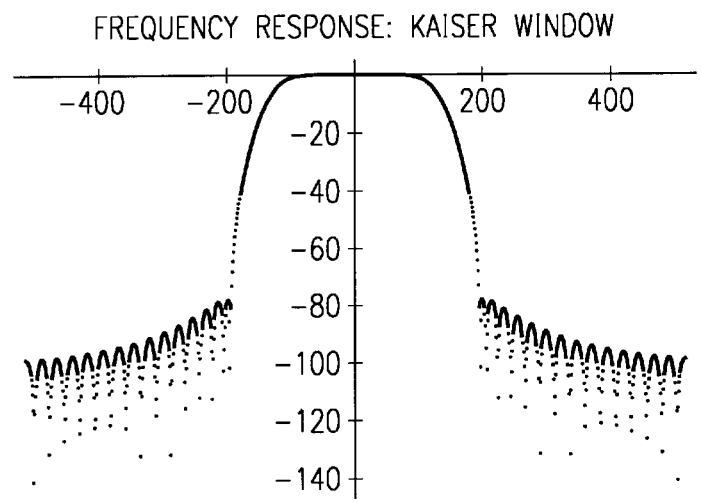

If instead a window (such as a Kaiser window) tapers $h_s(t)$ to 0 by the fifth zero-crossing, the resulting frequency response has the form shown in FIG. 5. That is, replace sinc(t/T) with $h_s(t)=\text{sinc}(t/T) w_K(t)$. Note that the Kaiser window is given by:

$$w_K(t)=I_0(b\sqrt{(1-t^2/\tau^2)})/I_0(b) \text{ for } |t|\leq\tau$$

$$=0 \text{ for } |t|>\tau$$

where $I_0(.)$ is the modified Bessel function of order zero, $\tau=(N-1)T/2$ is the half-width of the window, and b is a parameter which provides a tradeoff between main lobe width and side lobe ripple height. Note that for small z, $I_0(z)=1+z^2/4+ \ldots$ , and for large z, $I_0(z)\sim e^z/\sqrt{2\pi z}$.

Figure 6:
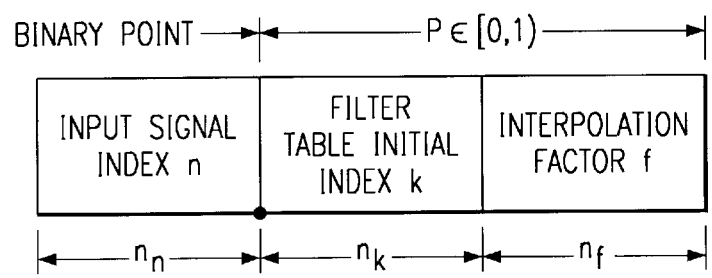
FIG. 6 indicates the bits of a time register.
Figure 7:
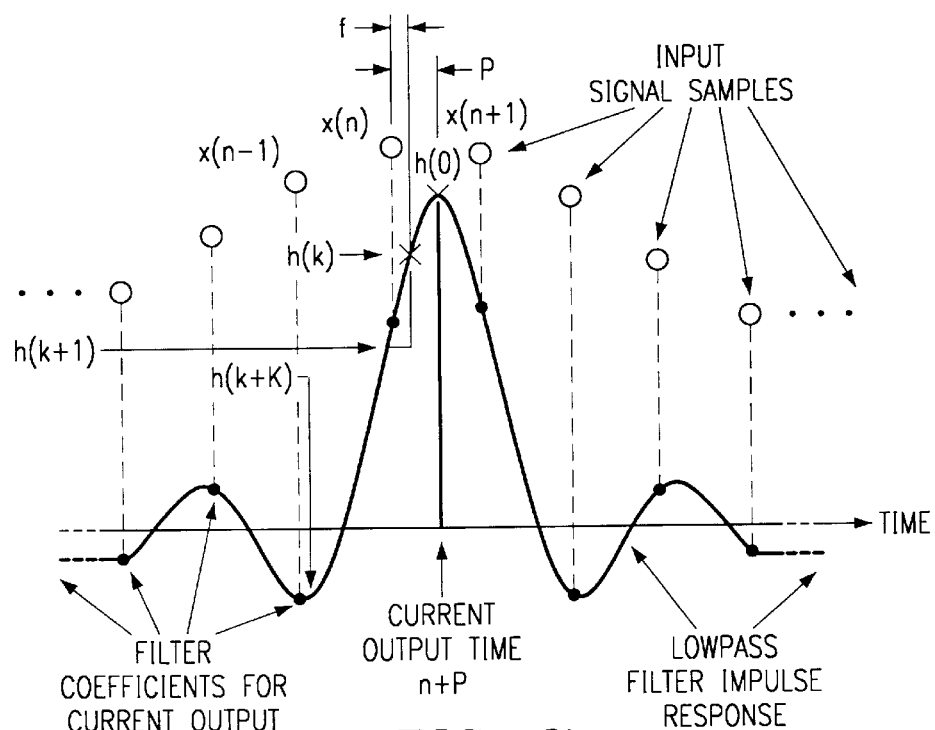
FIG. 7 graphically illustrates filter coefficient interpolation.

The following implementation provides signal evaluation at an arbitrary time where time is specified in units of the input sampling period T. FIG. 6 shows the time register t, and FIG. 7 shows an example configuration of the input signal and lowpass filter at a given time. The time register is divided into three fields: The leftmost field gives the time as the number n of samples into the input signal buffer (that is, $nT\leq\text{time}<(n+1)T$ and the input signal buffer contains the values x(nT) indexed by n), the middle field is an initial index k into the filter coefficient table h(k) (that is, the windowed impulse response values $h_s(kT/K)$ where K is the number of samples per zero-crossing), and the rightmost field is interpreted as a factor f between 0 and 1 for doing linear interpolation between samples k and k+1 (initially) in the filter coefficient table (that is, interpolating $h_s(kT/K)$ and $h_s((k+1)T/K)$). The concatenation of k and f is called P in the range [0,1) which is interpreted as the position of the current time between samples n and n+1 of the input signal (that is, P represents the time interval $kT/K+fT/K$ so $t=nT+kT/K+fT/K=(n+P)T$ with $P=(k+f)/K$).

Let the three fields have nn, nk, and nf bits, respectively. Then the input signal buffer contains $N=2^{nn}$ input samples, and the filter table contains $K=2^{nk}$ "samples per zero-crossing." (The term "zero-crossing" is precise only for the case of the ideal lowpass h( ); to cover practical lowpass h( ) cases generalize "zero-crossing" to mean a multiple of time $T_C$, where $T_C=1/F_C$ and $F_C$ is the lowpass cutoff frequency. For example, to use the ideal lowpass filter, the table entry h(k) would be sinc(k/K), and generally the entry h(k) is $h_s(kT/K)$.

This implementation stores only the "right wing" of a symmetric finite impulse response (FIR) filter designed by the window method based on a Kaiser window. It also stores a table of differences $\Delta h(k)=h(k+1)-h(k)$ between successive FIR sample values in order to speed up the linear interpolation. The length of each table is then K(Nz+1) where Nz is the number of zero-crossings that the windowed impulse response extends from the origin.

Figure 8:
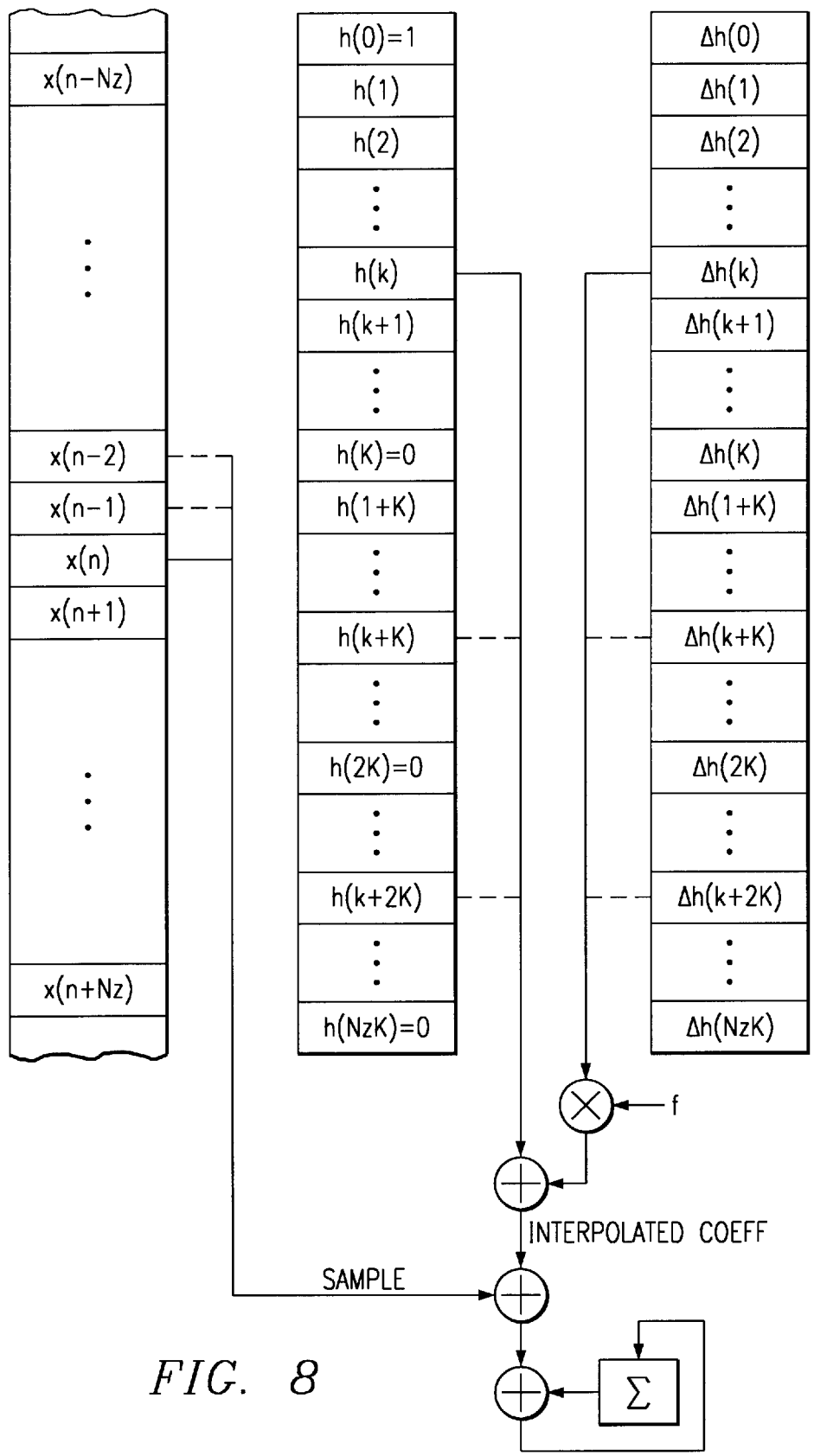
FIG. 8 shows filter computations.

Consider a sampling-rate conversion by the factor r=F'/F: for each output sample, the basic interpolation equation (1) is performed. The filter table is traversed twice: first to apply the left wing of the FIR filter, and second to apply the right wing. After each output sample is computed, the time register is incremented by $2^{nk+nf}/r$; that is, time is incremented by 1/r in fixed-point format. Suppose the time register t has just been updated, and an interpolated output y(t) is desired. For r≧1, the output is computed as follows where the sums are over j=0, 1, . . . , Nz:

set $v=\Sigma_j[h(k+jK)+f\Delta h(k+jK)]x(n-j)$ (the left wing sum)

replace P by 1–P $y(t)=v+\Sigma_j[h(k+jK)+f\Delta h(k+jK)]x(n+1+j)$ (the right wing sum)

where x(n) is the current input sample (that is, nT≦t<(n+1)T), and f in [0, 1) is the interpolation factor. FIG. 8 illustrates the left wing sum with the coefficient table and difference table and step size K through each table.

When r is less than 1, the initial P is replaced by P'=rP, 1–P becomes r–P'=r(1–P), and the step-size through the filter coefficient table is reduced to rK instead of K; this lowers the filter cutoff to avoid aliasing. Note that f is fixed throughout the computation of an output sample when r≧1 but f changes when r<1.

When r<1, more input samples are required to reach the end of the filter table, thus preserving the filtering quality. The number of multiply-adds per second is approximately (2N+1)max{F, F'}. Thus the higher sampling rate determines the work rate. Note that for r<1 there must be [NF/F'] extra input samples available before the initial conversion time and after the final conversion time in the input buffer. As r tends to 0, the required extra input data becomes infinite, and some lower bound on r must be chosen. For r at least 1, only N extra input samples are required on the left and right of the data to be resampled, and the upper bound for r is determined only by the fixed-point number format; namely, r–max=$2^{nk+nf}$.

If nc denotes the word-length of the stored impulse response samples, then one may choose nk=1+nc/2 and nf=nc/2 to obtain nc–1 effective bits of precision in the interpolated impulse response. Thus with 16-bit (1 sign bit and 15-bit fixed point precision) storage for the impulse response samples, take nk=8 (which means a sampling density of 256 per zero-crossing) and nf=7 bits. In this case the interpolation does not introduce an error larger than the quantization error.

Note that rational conversion factors of the form r=K/M, where K=$2_{nk}$ and M is an arbitrary positive integer, do not use the linear interpolation feature because f=0. In this case the method reduces to the normal type of bandlimited interpolator. With the availability of interpolated lookup, however, the range of conversion factors is boosted to the order of $2^{nk+nf}$/M. For example, with r≈1, nk=9, nf=8, this is about 5.1 decimal digits of accuracy in the conversion factor r. Without interpolation, the number of significant figures in r is only about 2.7.

The number Nz of zero-crossings stored in the table is an independent design parameter. For example, the use of Nz=13 in a system designed for audio quality with 20% oversampling suffices.

For a given quality specification in terms of aliasing rejection, a tradeoff exists between Nz and sacrificed bandwidth. The lost bandwidth is due to the so-called "transition band" of the lowpass filter. In general, for a given stop-band specification (such as "80 dB attenuation"), lowpass filters need approximately twice as many multiply-adds per sample for each halving of the transition band width.

It is worth noting that a given percentage increase in the original sampling rate ("oversampling") gives a larger percentage savings in filter computation time, for a given quality specification, because the added bandwidth is a larger percentage of the filter transition bandwidth than it is of the original sampling rate. For example, given a cutoff frequency of 20 kHz, (ideal for audio work), the transition band available with a sampling rate of 44 kHz is about 2 kHz, while a 48 kHz sampling rate provides a 4 kHz transition band. Thus, a 10% increase in sampling rate halves the work per sample in the digital lowpass filter.

Some preferred embodiments differ from the foregoing in that the oversampling of the windowed impulse response h( ) to create the coefficient table entries h(k) is performed at a higher rate for the center portion of the impulse response function. This relies on the fact that the main lobe of an impulse response contains most of the energy for the pass band spectrum, which is important for reconstructing the new data stream. Thus the main lobe should have the highest sampling rate possible. Higher sampling rate produces less interpolation error due to having more points to begin with. The side lobes contain only a fraction of the energy of the main lobe, indeed, close to zero, and have small-to-no-difference between successive impulse response values. If these lobes were sampled coarsely, the number of filter coefficients would be reduced. Though the side lobes have values close to zero, they cannot be ignored; these side lobes help achieve a low signal-to-noise ratio in the stop band.

Figure 9:
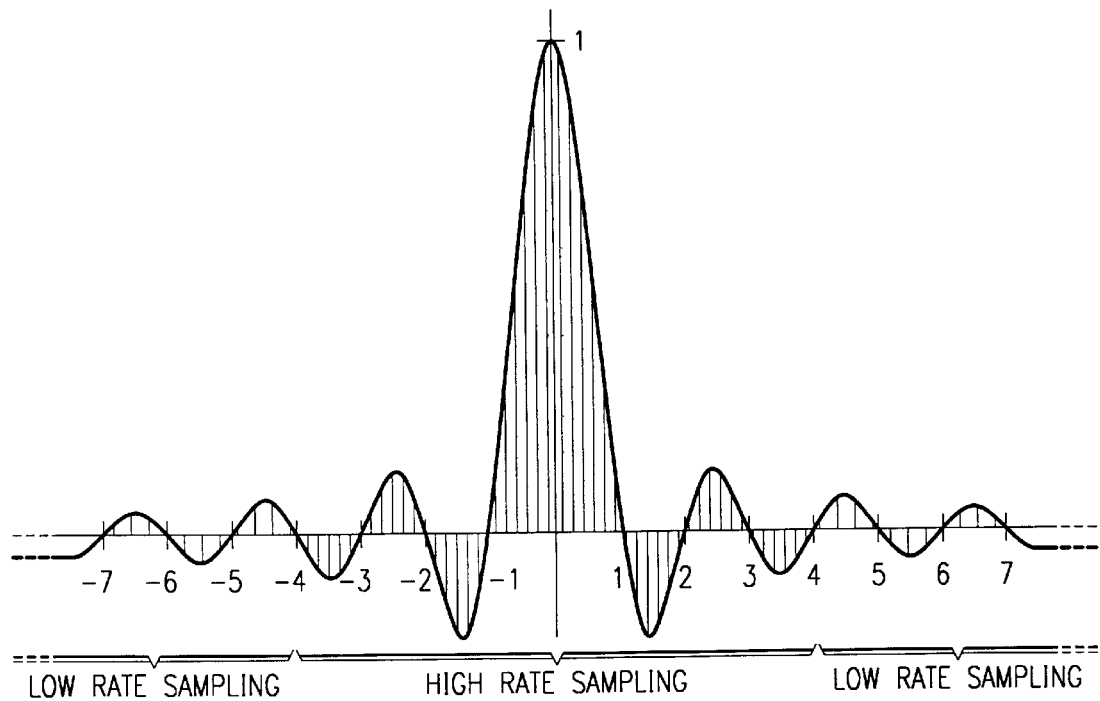
FIG. 9 illustrates preferred embodiment differential oversampling.

In particular, a first preferred embodiment proceeds as follows. First form a windowed impulse response by multiplying a sinc function by a Kaiser window with a –100 dB stopband and extending 42 zero-crossings (21 in each direction from the origin). Then generate filter coefficients (which will be stored in a table in memory) by sampling the windowed impulse response at a rate of 256 samples per zero-crossing in the central 21 lobes (22 zero-crossing intervals) and at a rate of 32 samples per zero-crossing in the 10 outlying side lobes on each side. Thus the main lobe has 511 non-zero samples, each of the 20 other central lobes has 255 non-zero samples, and each of the 20 outlying side lobes has 31 non-zero samples. (FIG. 9 illustrates the idea of different sampling rates in the simplified case of 7 zero-crossings on each side with sampling at 8 samples per zero-crossing in the central lobe plus adjacent lobes and sampling at 4 samples per zero-crossing in the three side lobes of both the left and right.)

That is, analogous to the previously described interpolation method, this preferred embodiment first performs the sum over j=0, 1, . . . , 10 for the 11 zero-crossings for the left wing of the center lobes using h(k) from the center lobe table of coefficients containing 11*256=2816 entries and k and f defined from t=nT+kT/256+fT/256 in the center time register:

$$\text{set } v=\Sigma_j[h(k+j256)+f\Delta h(k+j256)]x(n-j) \quad \text{(left center wing sum)}$$

Then the sum over j=11, 12, . . . , 20 for the 10 zero-crossings for the left wing of the side lobes using h'(k') from the side lobe table of coefficients containing 10*32=320 entries (indexed from 11*32 to 21*32) of impulse samples with k' and f' defined from t=nT+k'T/32+f'T/32 in the side time register (so k'=[k/8] and f'=k/8−[k/8]+f/8):

$$\text{set } w=v+\Sigma_j[h'(k'+j32)+f'\Delta h'(k'+j32)]x(n-j) \quad \text{(left side wing sum)}$$

Then perform the right side sums by replacing P by 1−P and again splitting into sums over j=0, 1, . . . , 10, and j=11, 12, . . . , 20.

$$\text{set } z=w+\Sigma_j[h(k+j256)+f\Delta h(k+j256)]x(n+1+j) \quad \text{(right center wing sum)}$$

$$y(t)=z+\Sigma_j[h'(k'+j32)+f'\Delta h'(k'+j32)]x(n+1+j) \quad \text{(right side wing sum)}$$

Figure 10:
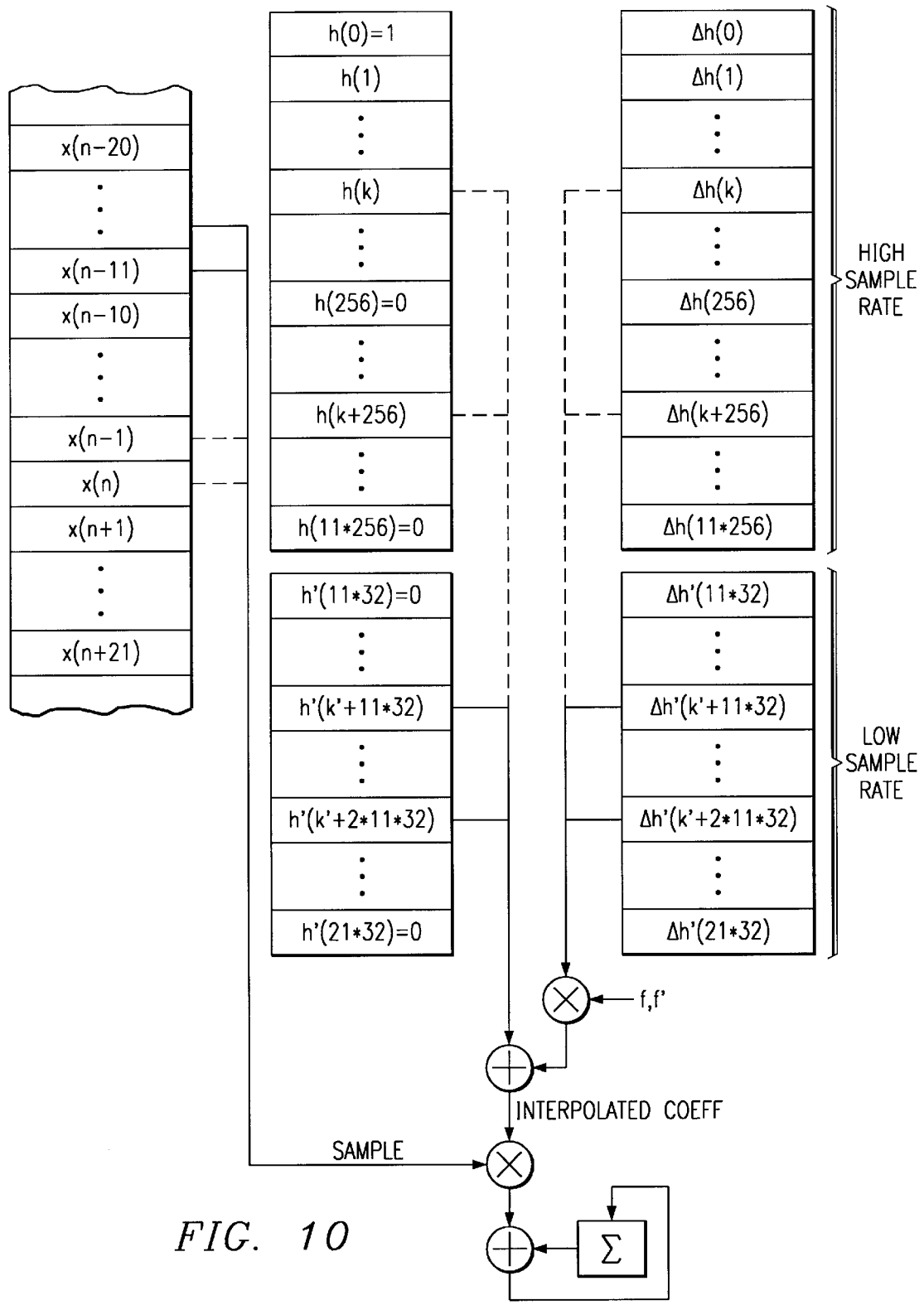
FIG. 10 shows preferred embodiment differential oversampling.

FIG. 10 illustrates these two-step size coefficient tables.

The windowed impulse response samples are 16-bit fixed-point numbers; and the total number (including the sample zeros at the zero-crossings) of samples is 6272 (=256*22+32*20). In contrast, if all of the lobes were sampled at 256 per zero-crossing, then there would be 10752 (=256*42) samples. Thus the preferred embodiment provides substantial memory savings in the coefficient storage, but increased program code storage as follows.

Figure 11:
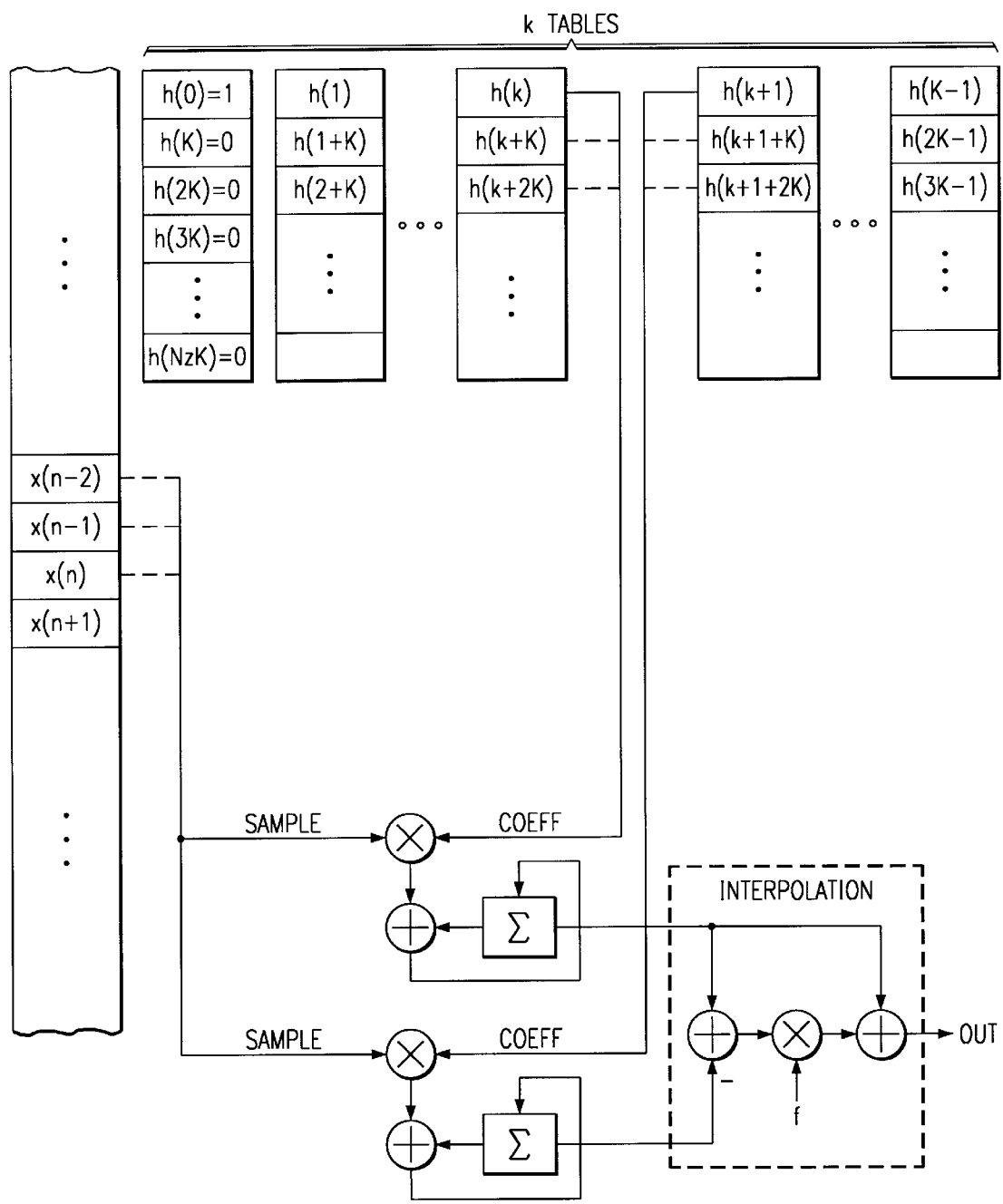
FIGS. 11–12 illustrate preferred embodiment multibank filterings and interpolation.
Figure 12:
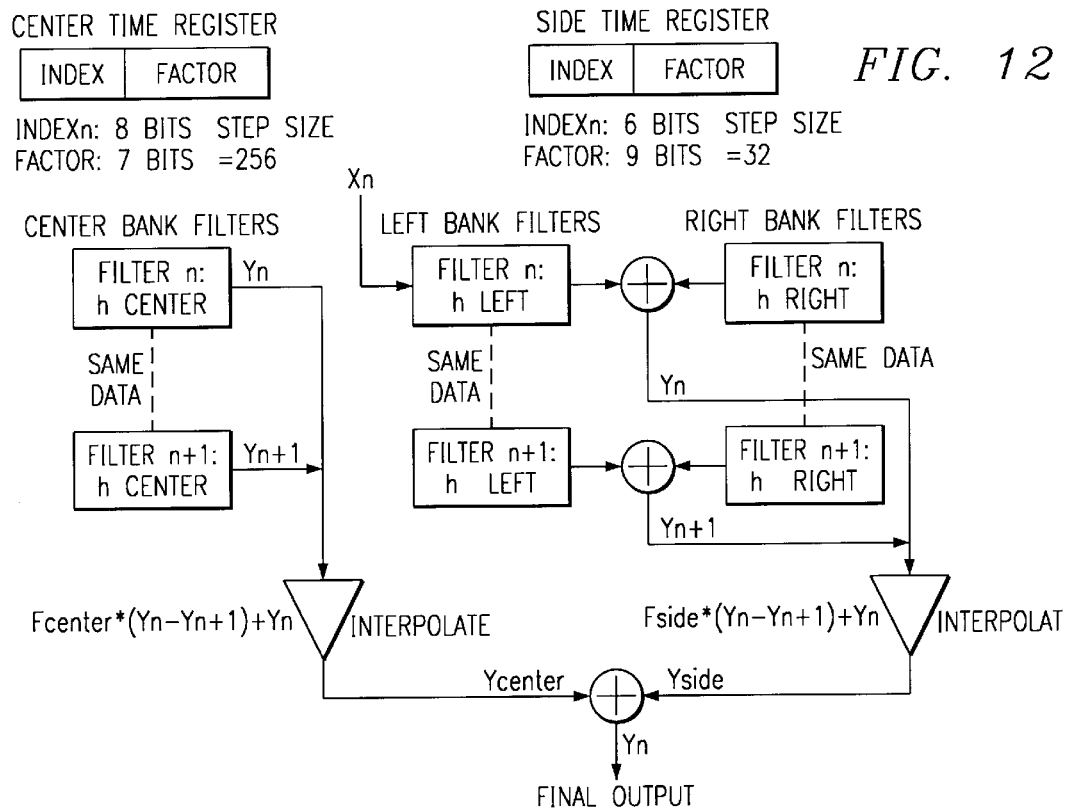

As shown in FIGS. 8 and 10, the previously-described implementations uses filter coefficients interpolated from a sampled windowed impulse response and then use such interpolated coefficients to multiply the input signal samples and accumulate. The samples used are step-size apart in the impulse response sample tables (which is K entries apart in FIG. 8 and either 256 or 32 apart in FIG. 10). In contrast, alternative preferred embodiments reorganize the impulse response samples not as one large table, but rather as a set of step-size-number of coefficient banks (e.g., K banks). Then the input signal samples could be filtered by both the current bank and the next consecutive bank to produce two results which would be interpolated by one final interpolation to produce one final new sample; see FIGS. 11 and 12 showing cases of coefficients from uniformly sampled and differentially sampled impulse response, respectively. More explicitly, the procedure in FIG. 11 for the left wing is:

$$\text{set } v=\Sigma_j h(k+jK)x(n-j)$$

$$\text{set } w=\Sigma_j h(k+1+jK)x(n-j)$$

$$y(t)=v+f(v-w)$$

This method greatly reduces computation, as the multiply-accumulate (MAC) operation could easily use a specified bank with one final subtract and multiply for interpolation instead of a subtract and multiply for each coefficient for each zero-crossing. The number of MACs would double as the filtering would be performed twice, yet there would be significant savings in overall computation, due to the elimination of the set-up and execution of the subtract. Also, this eliminates the coefficient increment Δh table.

For a fixed-point digital signal processor, the MAC instruction is single cycled. The addressing modes are set-up to more easily go through a buffer of input data twice for the double filtering than to re-index for coefficient interpolation with temporary storage.

The time register is updated every output sample to determine which coefficient banks and which interpolation factor to use. The updated value is based upon the rate conversion factor. The same time register can be used regardless of the step size. It needs to be accessed twice to obtain the current interpolation factor and current coefficient bank. For the preferred embodiment methods with two step sizes but only one time register, the time register needs to be read twice to obtain the proper index and factor for each step size filtering.

The use of the time register as previously described allows a 16-bit processor to perform rate conversion in ~1 Hz increments for rates from 100 Hz to 48 kHz. Use of all 16 bits in a time register allows ~1 Hz granularity. The time register is computed thusly: time delta=(1/factor)(1<<15)= (1/48/44.1)*32768=30,105=7599 hex, where the factor is the ratio of output frequency to input frequency.

FIG. 12 illustrates preferred embodiment oversampling in the center lobes plus organization into filter banks. There are a total of six filterings needed: two for the center lobes, two for the left lobes, and two for the right lobes. First, for the center lobes the index of the time register specifies the current bank of coefficients to use (bank n). The next coefficient bank (bank n+1) with current data result is subtracted from the bank n result and multiplied by the interpolation factor f and then added to bank n result to produce an interpolated value for the center main lobes. The same filtering procedure is used for the left and right side lobes, except the side filter output values are summed then interpolated. One side lobe interpolation is performed since both side lobe sets of filter banks use the same factor. The two interpolated values are summed to produce the final value.

The overhead for six filters (two step sizes) is much greater than for two filters (one step size). That requires approximately 15% more MIPs to produce the output sample. Yet, the trade-off is valid since program coefficient storage is reduced by 40%.

Indeed, the break point for impulse response sampling rate change (step size change), and thus storage demand, can be determined experimentally by considering the size of the increments of the side lobe samples using the high sampling rate. For the foregoing with center lobe sampling density of 256 per zero-crossing and 16-bit storage of the samples, the increments of side lobe samples is 0 or 1 LSB in about half of the lobes. This suggests the break out with the left side (switch to low sampling rate) be about 25% of the zero-crossings, the center (high sampling rate) about 50% of the zero-crossings, and the right side (low sampling rate) the remaining 25% of the zero-crossings.

FIG. 12 shows the filter coefficients being split into three sets: left side, center, and right side with each set having filter banks. An alternative uses just half the storage by again summing one half and then replacing P by 1−P for the other half sum.

Modifications

The preferred embodiments can be modified in various ways while retaining the features of differential oversampling or storage of filter coefficients in banks and interpolation after adjacent bank filterings.

For example, the sampling rate of the impulse response function could be at three or more different rates, such as the three center lobes at 512 samples per zero-crossing, the next 10 lobes at 128 samples per zero-crossing, and the remaining lobes at 32 samples per zero-crossing.

What is claimed is:

1. A method of sampling rate conversion, comprising:

(a) providing data samples of a first sampling rate;

(b) providing impulse response function samples of at least two sampling rates;

(c) combining products of said data samples and said impulse response function samples to form data samples of a second sampling rate.

2. The method of claim 1, wherein:

(a) said impulse response function samples for the center lobes of said impulse response function are of double the sampling rate for said impulse response function samples for side lobes removed from the center lobes.

3. A sampling rate converter, comprising:

(a) a buffer for input data samples of a first sampling rate;

(b) an array of impulse response function samples wherein the samples are at two or more sampling rates;

(c) a multiplier coupled to said array and said buffer; and (d) an accumulator coupled to said multiplier to form output data samples of a second sampling rate.

* * * * *